United States Patent
Moore et al.

(10) Patent No.: US 7,339,490 B2
(45) Date of Patent: Mar. 4, 2008

(54) MODULAR SENSOR ASSEMBLY

(75) Inventors: David Allen Moore, Tomball, TX (US); Robert Allen Pereira, Spring, TX (US); Ratnesh K. Sharma, Union City, CA (US); Cullen E. Bash, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 663 days.

(21) Appl. No.: 10/880,869

(22) Filed: Jun. 29, 2004

(65) Prior Publication Data

US 2005/0286220 A1 Dec. 29, 2005

(51) Int. Cl.
*G08B 23/00* (2006.01)
*G08B 1/08* (2006.01)
*H04Q 7/00* (2006.01)
*G06F 1/16* (2006.01)
*H05K 5/00* (2006.01)

(52) U.S. Cl. .............................. 340/693.5; 340/539.27; 361/686

(58) Field of Classification Search ................ 340/693.5–693.12, 438, 449, 500–539.32, 340/601–604, 628, 635–656, 3.1, 3.5–3.54, 340/3.7–3.9, 825.36–825.78, 286.01–286.05; 361/683, 686–727; 454/193
See application file for complete search history.

(56) References Cited

U.S. PATENT DOCUMENTS

| | | | |
|---|---|---|---|
| 4,589,712 A | 5/1986 | Hastings | |
| 4,639,713 A * | 1/1987 | Kitagawa et al. | 340/427 |
| 4,823,290 A * | 4/1989 | Fasack et al. | 340/825.01 |
| 5,574,430 A * | 11/1996 | Ott et al. | 340/568.2 |
| 5,718,628 A * | 2/1998 | Nakazato et al. | 454/184 |
| 5,949,974 A | 9/1999 | Ewing et al. | |
| 5,982,618 A | 11/1999 | Roos | |
| 6,100,807 A | 8/2000 | Orr | |
| 6,268,664 B1 | 7/2001 | Rolls et al. | |
| 6,283,380 B1 * | 9/2001 | Nakanishi et al. | 236/49.3 |
| 6,525,935 B2 | 2/2003 | Casebolt | |
| 6,529,127 B2 * | 3/2003 | Townsend et al. | 340/505 |
| 6,574,104 B2 | 6/2003 | Patel et al. | |
| 6,577,498 B1 | 6/2003 | Land et al. | |
| 6,632,995 B1 | 10/2003 | Knieriem | |
| 6,639,794 B2 * | 10/2003 | Olarig et al. | 361/687 |
| 6,714,977 B1 | 3/2004 | Fowler et al. | |
| 6,934,864 B2 * | 8/2005 | Chu et al. | 713/324 |
| 7,164,580 B2 * | 1/2007 | DiStefano | 361/687 |
| 2006/0244616 A1 * | 11/2006 | Hill | 340/604 |

* cited by examiner

*Primary Examiner*—Benjamin C. Lee
*Assistant Examiner*—Jennifer Mehmood

(57) ABSTRACT

A modular sensor assembly for sensing conditions at a computer rack, such as environmental conditions. The sensor assembly includes an elongate flexible body, configured to attach to a computer rack, with a plurality of addressable sensors, disposed along the body and interconnected to a common connector wire. A connector wire lead is provided to interconnect the connector wire to a central system configured to receive and interpret data from the plurality of sensors relating to conditions associated with the computer rack.

28 Claims, 4 Drawing Sheets

MODULAR SENSOR ASSEMBLY

BACKGROUND OF THE INVENTION

1. Field of the Invention

The present invention relates generally to a sensor system for monitoring conditions in a data center.

2. Related Art

A data center may be defined as a location, e.g., a room, that houses numerous printed circuit (PC) board electronic systems arranged in a number of racks. A standard rack may be defined as an Electronics Industry Association (EIA) enclosure, 78 in. (2 meters) high, 24 in. (0.61 meter) wide and 30 in. (0.76 meter) deep. Standard racks may be configured to house a number of PC boards, e.g., about forty (40) PC server systems, with some existing configurations of racks being designed to accommodate up to 280 blade systems. The PC boards typically include a number of components, e.g. processors, micro-controllers, high speed video cards, memories, and the like, that dissipate relatively significant amounts of heat during the operating of the respective components. For example, a typical PC board comprising multiple microprocessors may dissipate approximately 250 W of power. Thus, a rack containing forty (40) PC boards of this type may dissipate approximately 10 KW of power.

The power required to remove the heat dissipated by the components in the racks is generally equal to about 10 percent of the power needed to operate the components. However, the power required to remove the heat dissipated by a plurality of racks in a data center is generally equal to about 50 percent of the power needed to operate the components in the racks. The disparity in the amount of power required to dissipate the various heat loads between racks and data centers stems from, for example, the additional thermodynamic processing needed in the data center to cool the air.

In one respect, racks are typically cooled with fans that operate to move cooling fluid, e.g., air, across the heat dissipating components; whereas, data centers often implement reverse power cycles to cool heated return air. The additional work required to achieve the temperature reduction, in addition to the work associated with moving the cooling fluid in the data center and the condenser, often add up to the 50 percent power requirement. As such, the cooling of data centers presents problems in addition to those faced with the cooling of racks.

Conventional data centers are typically cooled by operation of one or more air conditioning units. The compressors of the air conditioning units typically require a minimum of about thirty (30) percent of the required cooling capacity to sufficiently cool the data centers. The other components, e.g., condensers, air movers (fans), etc., typically require an additional twenty (20) percent of the required cooling capacity. As an example, a high density data center with 100 racks, each rack having a maximum power dissipation of 10 KW, generally requires 1 MW of cooling capacity.

Air conditioning units with a capacity of 1 MW of heat removal generally require a minimum of 30 KW input compressor power in addition to the power needed to drive the air moving devices, e.g., fans, blowers, etc. Conventional data center air conditioning units do not vary their cooling fluid output based on the distributed needs of the data center. Instead, these air conditioning units generally operate at or near a maximum compressor power even when the heat load is reduced inside the data center.

The substantially continuous operation of the air conditioning units is generally designed to operate according to a worst-case scenario. That is, cooling fluid is supplied to the components at around 100 percent of the estimated cooling requirement. In this respect, conventional cooling systems often attempt to cool components that may not need to be cooled. Consequently, conventional cooling systems often incur greater amounts of operating expenses than may be necessary to sufficiently cool the heat generating components contained in the racks of data to the components at around 100 percent of the estimated cooling requirement. In this respect, conventional cooling systems often attempt to cool components that may not need to be cooled. Consequently, conventional cooling systems often incur greater amounts of operating expenses than may be necessary to sufficiently cool the heat generating components contained in the racks of data centers.

Consequently, the inventors have developed systems for collecting temperature data from data centers so that the computing equipment can be cooled based on actual cooling requirements. Such systems can include large numbers of temperature sensors to provide detailed temperature information from many different locations within the data center, allowing a cooling system to provide cooling only where it is needed, and only to the extent actually needed by the electronic systems.

Unfortunately, the traditional approach to sensing large numbers of temperatures distributed throughout a large volume is costly and cumbersome. Typically thermistor or thermocouple sensors are used. These sensors require that a continuous wire be installed from the sensor location to a central instrument where temperature readings are made. Each sensor must be connected to the instrument with its own wire. The wire involved must meet special manufacturing and installation characteristics to provide an accurate result. This results in a very costly and cumbersome installation with large bundles of expensive wire spread throughout the measurement environment. The cost of these methods can be quite high.

A typical temperature data acquisition system could include a central datalogger which contains a switch matrix and analog-to-digital converter, with cold-junction compensation for thermocouple input. Such systems are available that are capable of measuring 60 thermocouple temperature sensors, though this is not a limit. Some systems expand to accommodate a thousand sensors. Unfortunately, this sort of system requires installation of a continuous thermocouple wire from each measurement point to the instrument. Thermocouple wire is a specialized material that must be installed to special requirements for accurate results. Each conductor is a different material, and all junctions must maintain material integrity from sensor to instrument. This requires special connectors and installation procedures.

Industrial versions of this type of equipment are also available, and present similar disadvantages. One such concept is the use of separate "transmitters" at each measurement point that convert from a thermocouple to a network protocol at each measurement point. This is a very costly approach, and requires that power be supplied at each measurement point. Additionally, any installation using traditional techniques would require custom mounting of sensors in the field. This can lead to a visually unappealing installation. Field installation also often results in wire routing that leaves sensor wire vulnerable to damage during operation of the data center.

Accordingly, it has been recognized that it would be advantageous to develop a distributed network of sensors that is simple to install on new or existing equipment rack systems, and that provides a low cost sensor assembly for deploying multiple sensors over a widely distributed area.

SUMMARY OF THE INVENTION

The invention advantageously provides a modular sensor assembly for sensing conditions at a computer rack. The sensor assembly includes an elongate flexible body, configured to attach to a computer rack, with a plurality of addressable sensors, disposed along the body and interconnected to a common connector wire. A connector wire lead is provided to interconnect the connector wire to a central system configured to receive and interpret data from the plurality of sensors relating to conditions associated with the computer rack.

Additional features and advantages of the invention will be apparent from the detailed description which follows, taken in conjunction with the accompanying drawings, which together illustrate, by way of example, features of the invention.

DETAILED DESCRIPTION

Figure 1A:
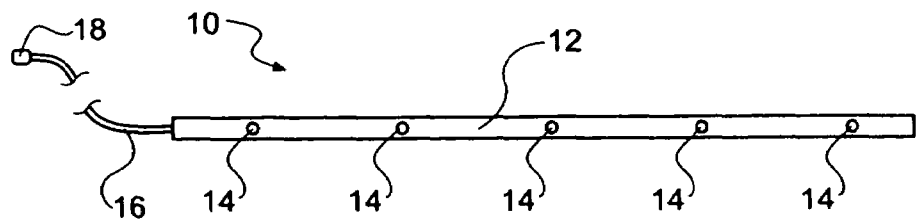
FIG. 1A is a plan view of one embodiment of a sensor assembly.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the invention as illustrated herein, which would occur to one skilled in the relevant art and having possession of this disclosure, are to be considered within the scope of the invention.

Figure 1B:
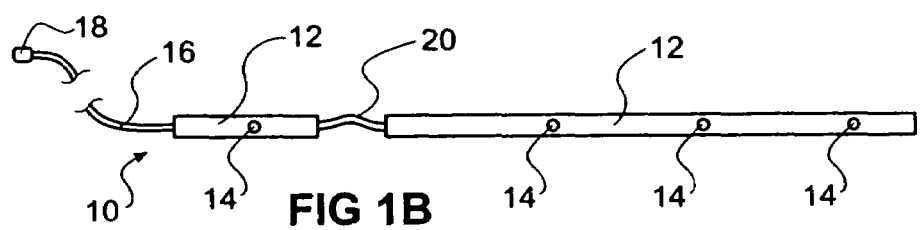
FIG. 1B is a plan view of an alternative embodiment of a sensor assembly.

Depicted in FIGS. 1A and 1B are two embodiments of a modular sensor assembly 10. The sensor assembly generally comprises an elongate flexible body 12, with a plurality of sensors 14 disposed along it. A connector wire 16, such as flat phone-type wire, extends from one end of the body, and includes a connector 18, such as a telephone-type modular connector, for allowing the connector wire to be interconnected to a computer network, so that temperature or other data can be communicated from the sensors to the network. The sensor assembly can be substantially continuous as in FIG. 1A, or can comprise more than one sensor segment interconnected by an intermediate connector wire 20, as shown in FIG. 1B. While the sensor assembly is depicted as a linear device, other topologies can also be used to deploy sensors.

Figure 2A:
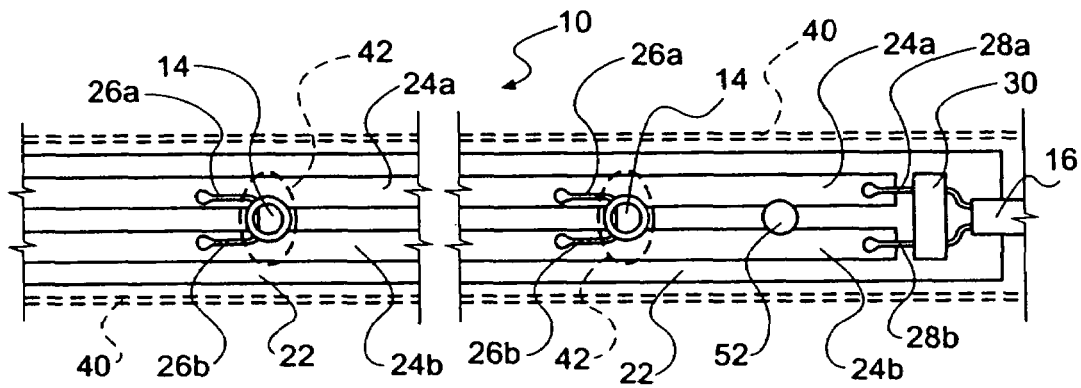
FIG. 2A is a top, partially disassembled view of a temperature sensor, showing various alternative configurations.
Figure 2B:
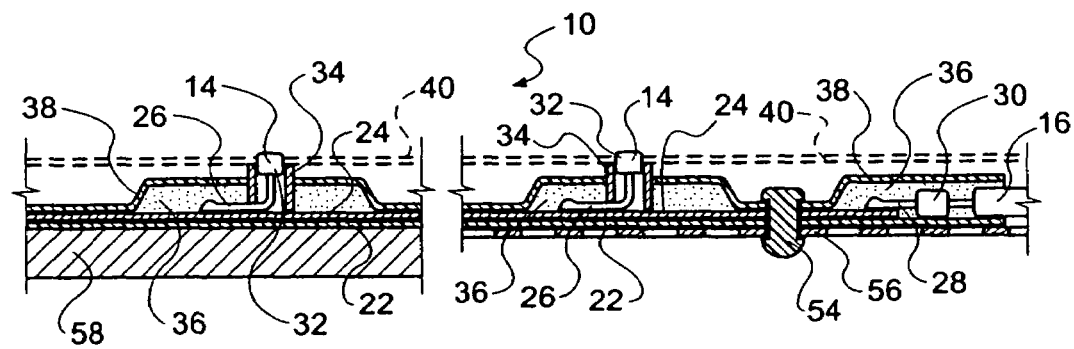
FIG. 2B is a side, cross-sectional view of the temperature sensor of FIG. 2A.

Depicted in FIGS. 2A and 2B are views showing the internal structure of the sensor assembly 10. The sensor assembly generally comprises several layers of material laminated together to form a rugged but flexible assembly. The sensor assembly includes a base layer 22, to which the other components are attached. The base layer can be a 0.010" thick plastic strip 0.75" wide. Rugged plastic tape could also be used for the base layer, for example.

Disposed atop the base layer 22 are multiple flat conductors 24. The conductors can be conductive tapewire, such as copper foil tape with an adhesive backing. Conductive foil or flex circuit tape can be used, such as copper tape foil CK1017 from Cir-Kit Concepts Inc. While two flat conductors are shown in the depicted embodiment, the sensor assembly is not limited to two, for reasons that are discussed below. Of the two flat conductors shown, one conductor 24a represents a data line and the other conductor 24b represents a ground line.

A sensor device 14 is attached (e.g. soldered) to the flat conductors 24 via its leads 26. There are a variety of sensor types and sensor products that can be used. One type of temperature sensor that the inventors have employed is a Dallas Semiconductor/Maxim integrated circuits DS18S20-PAR sensor. The sensor assembly can also be used to deploy other digital transducers or sensors with similar connectivity requirements but differing functionalities, such as transducers and sensors for detecting fluid pressure, fluid velocity, humidity, occupancy, light, smoke, door condition, etc. Multiple or redundant conductor assemblies can be developed to address connectivity requirements of a wide variety of transducers and provide customization (or upgrades). The sensor assembly can also be used beyond the rack assembly, for other non-rack related sensors like pressure transducers inside a plenum or temperature sensors for vents.

Each sensor 14 includes at least two connection leads 26. One lead 26a serves as a data connection lead while the other lead 26b is a ground connection lead. The data connection lead connects the sensor to a computer controller 110, shown in FIG. 6. The ground connection lead and the data connection lead can be configured either in one long wire pair, as shown, with multiple sensors in parallel.

Power for the sensor 14 is parasitically drawn from the data line 24a. Specifically, the sensor includes an internal capacitor, which draws power and charges during data line inactivity. Alternatively, a sensor without an internal capacitor could be used. Such a sensor could include three leads, one of which would be connected to a power supply line (not shown) that would be separate from the data and ground lines. Thus, such a system would require a third conductor line, in addition to the data line 24a and ground line 24b shown in the figures.

In the embodiment shown, the sensor 14 is configured to measure ambient temperature a small distance (e.g. 15 mm) from the sensor assembly, and convert the temperature reading into a digital signal. One advantage of implementing this type of sensor is that a central instrument is not needed. Each sensor is capable of independently converting physical temperature data to transmittable digital data. This eliminates the need to carry sensitive analog signals from point to point. The digital data provided by the sensor can be protected by CRC algorithms that prevent distortion of the data.

The connector wire 16 is a multiple conductor wire. In the depicted embodiment, the connector wire includes two conductors 28a, 28b, the ends of which are connected (e.g. soldered) to the ends of the flat conductors 24 to provide connectivity to the sensing network. One conductor 28a is the data line, and the other conductor 28b is the ground line. It will be apparent that where the sensor assembly includes more than two flat conductors, the connector wire will also include more than two corresponding conductors.

It will be apparent that there must be some way to identify and distinguish the physical location of each sensor in the system. This can be done in several ways. In one configuration, shown in FIG. 2A and 2B, attached to the conductor wire 16 at the base of the sensor assembly 10 is a memory device 30. This memory device is configured to contain configuration and identification information related to the sensors 14 that are attached to that particular sensor assembly. The memory device can be an EEPROM device that includes a memory table with the identification information for each sensor. Specifically, in one embodiment, each Dallas Semiconductor DS18S20-PAR sensor has a unique factory-assigned 64 bit identification code or address. The memory device can be configured to retain in memory the addresses of each sensor disposed downstream, so as to speed the collection of data. This configuration advantageously provides a two-conductor physical interface with a large address space.

However, the system is not limited to this configuration. As an alternative, the identification of each sensor 14 can be prescribed with a much smaller address, such as that used by I2C devices. However, this configuration requires at least four conductors on the sensor assembly, and also requires wiring (e.g. printed circuits) with passive components at each sensor for retaining address settings. Alternatively, a user-defined identification code for each sensor (rather than a factory-assigned code) can be prescribed and recorded in the memory device 30, the memory device being factory-set with the user-defined identification codes. As still another alternative, the central computer (110 in FIG. 6) can be programmed with each sensor address in order to accurately collect and interpret the sensor data.

The sensor assembly 10 can include a number of other features for ruggedness, durability, and convenience. In the embodiment shown in FIGS. 2A and 2B, a first protective cover 32, such as a short section of 1/16" shrink tubing, is provided to cover the leads 26 of the sensor 14, and a second protective cover 34, such as a short section of 1/4" shrink tubing, is provided to cover the entire sensor, leaving about 2 mm of the sensor protruding. A small piece of cushioning material 36, such as 1/8" thick double faced foam tape, is disposed around the second protective cover around the sensor, and a similar piece of cushioning material 36 is provided around the connector wire 16 and memory device 30. These protective covers, cushioning material, and similar features serve as strain relief and protective coverings for the various components, helping to prevent damage to the sensor, the memory device, the conductor wire, and related electrical connections. It will be apparent, however, that the functions of these features could be performed by different sorts of structures, and that the body of the sensor assembly could be configured in a variety of different ways.

A top layer 38 of plastic or other material is provided over the top of the sensor assembly to cover and protect it. This top layer can be of the same material and same basic size as the base layer 22 described above. An adhesive or adhesive layer, such as thin double-sided adhesive tape (not shown), can be applied to the top of the flat conductors 24 to adhere the top layer to the base layer and flat conductors between the sections of cushioning material 36.

The sensor assembly 10 can be disposed within a molding or other elongate protective structure, such as a channel 40 as depicted in FIG. 2. This channel includes multiple openings 42 to allow the individual sensors 14 of the sensor assembly to protrude through to the outer environment. The molding or channel can be of aluminum, plastic, or any other suitable material. The molding can provide a decorative trim piece for the equipment rack, and can be configured to attach to the inside or outside of the rack.

Figure 3:
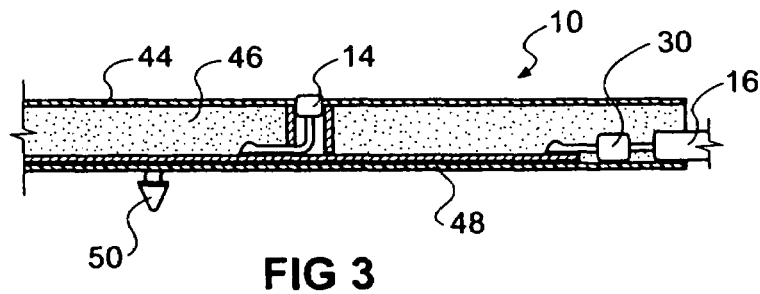
FIG. 3 is a side, cross-sectional view of an alternative embodiment of a sensor assembly.

Other configurations and materials can also be used for the sensor assembly. For example, as shown in FIG. 3, a semi-rigid top layer 44 can be adhered directly to a continuous layer 46 of internal cushioning material, rather than the small segments of cushioning material 36 shown in FIG. 2. This top layer can be of plastic, aluminum, or other material comprising a decorative molding or trim piece. Likewise, a bottom layer 48 disposed below the base layer 22 can be of a comparable material, and include mounting structure, such as an integral snap rivet 50 to accommodate mounting of the sensor assembly to a computer rack.

Depicted in FIG. 2 are some other features related to the use and installation of the sensor assembly 10. The sensor assembly can include one or more holes 52 (FIG. 2A) through which a snap rivet 54 (FIG. 2B) or other connector device can be inserted to attach the sensor assembly to a support structure 56, such as a perforated panel, mounting track, or other structure associated with a computer rack. Additionally, viewing the left side of FIG. 2B, it can be desirable to install the sensor assembly in a location where other support is not available, as described below. In such cases, a rigid or semi-rigid support member 58 can be mounted to the base layer 22 of the sensor assembly to provide the needed strength and support.

Figure 4:
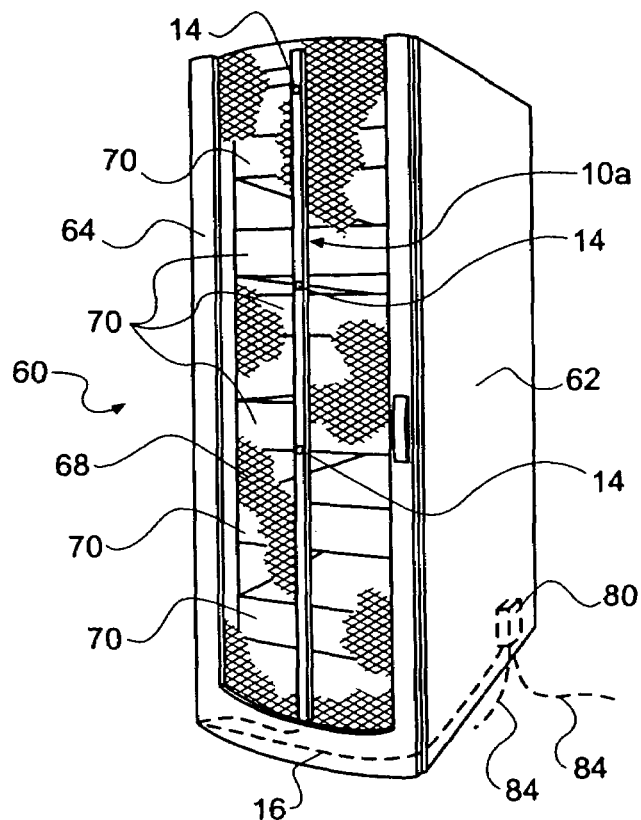
FIG. 4 is a front perspective view of one embodiment of an electronics rack configured with a sensor assembly.
Figure 5:
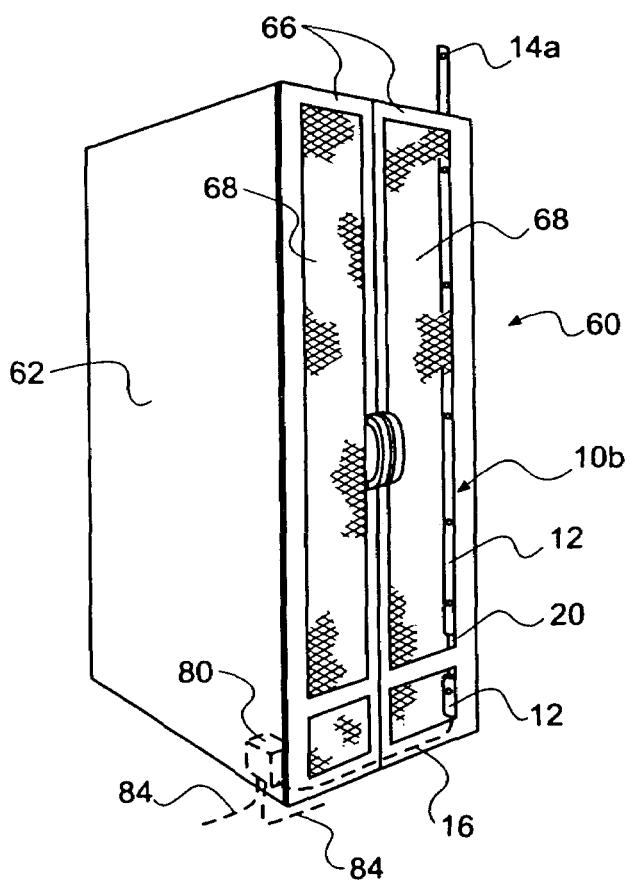
FIG. 5 is a rear perspective view of one embodiment of an electronics rack configured with a sensor assembly.

Depicted in FIGS. 4 and 5 are front and rear perspective views of one embodiment of an electronics rack 60 configured with sensor assemblies 10. There are a variety of equipment racks that are commercially available, and the application of the sensor assembly is not limited to compatibility with just one variety. The rack can be configured in various ways, and is not limited to the configuration shown. The rack shown in the drawings generally comprises an upright body 62, with an access door 64 on its front (FIG. 3) and a pair of access doors 66 on the back. The front and rear doors include a screen, mesh, or perforated panel 68 that allows air to flow through, and also allows users to view components and hardware inside.

The computer rack 60 houses a plurality of components 70, e.g., processors, micro-controllers, high speed video cards, memories, semi-conductor devices, and the like. The components may be elements of a plurality of subsystems (not shown), e.g., computers, servers, etc. In the performance of their electronic functions, the components, and therefore the subsystems, generally dissipate relatively large amounts of heat. Because computer rack systems have been generally known to include upwards of forty (40) or more subsystems, they may need substantially large amounts of cooling resources to maintain the subsystems and the components generally within a predetermined operating temperature range. Additionally, the temperature of cooling air supplied by a data center cooling system is likely to vary based on distance between the cooling equipment and the computer rack. Accordingly, temperature readings associated with the operation of the computer rack are gathered at multiple points in the vertical and horizontal directions.

The sensor assemblies 10 can be configured to fit onto installation features built into the rack 60. For example, the front sensor assembly 10a, shown in FIG. 4 is a continuous sensor assembly installed on a cosmetically pleasing trim strip, and is mounted on the perforated panel 68 of the front door 64 of the rack. The sensor assembly includes three sensors 14, for obtaining a measurement of inlet air temperature from near the bottom to the top of the rack. If the rack does not include a front door, the sensor assembly can be installed on or in a trim strip at an edge of the front of the rack.

As shown in FIG. 5, the rear sensor assembly 10b can be designed to mount within the rear cavity of the rack 60, inside one of the rear doors 66. Alternatively, the sensor assembly could be configured to mount on the rear mounting channels. Cosmetic appearance is not as important in the rear of the rack, but mounting flexibility is. There are typically many obstructions in this area, and mounting of a continuous sensor assembly may be difficult. For this reason the rear sensor assembly 10b shown is configured like that of FIG. 1B, comprising more than one sensor section 12, interconnected by a flexible intermediate connector wire 20. The flat sensor sections make installation simple, and the intermediate connector wire provides for routing around obstacles, such as the cross bar of the rack door, etc.

It is also notable that the rear sensor assembly 10b includes an overhead sensor 14a that is disposed on a portion of the sensor assembly extending above the rack 60. This configuration can be accommodated in various ways. For example, where the sensor assembly is disposed inside the rear doors 66, the overhead portion of the sensor assembly can be a discontinuous portion that is connected to the remainder of the assembly via a connector wire. This wire can extend unobtrusively between the adjacent door and the body of the rack. The overhead portion of the sensor assembly can be attached to additional support structure, such as an upright rod, that is associated with the rack. Alternatively, the overhead portion of the sensor assembly can include a support member like the support member 58 shown in FIG. 2B. Other configurations are also possible to provide for overhead sensors.

The sensor assemblies 10 are designed to facilitate easy mounting on an equipment rack, either at the factory before shipment to the customer, or at the customer site for installation as an option. This is accomplished by building mounting features into the rack that will accommodate the sensor assembly. These features can be in the form of a channel or series of holes in the surface of the rack (designed to receive snap rivets or other connectors), and are designed to fit mounting provisions on the rack. When a sensor assembly is not installed at a given location that is configured to receive one, a compatible blank trimming strip can be installed at that location to cover the exposed mounting locations. In this way a cosmetically appealing appearance can be maintained whether or not the sensor assembly is installed.

Mounting point features designed into equipment racks make installation of the sensor assembly a simple process. The sensor assemblies may also be retrofitted onto racks without mounting features by using adhesive to connect the sensor body 12 to the rack, such as by using double-sided adhesive tape.

The sensor assembly solves some of the manufacturing and installation problems for networked environmental sensors. It provides a system for deploying a widely distributed sensor network with simple parallel wiring. The labor-intensive and costly installation process of traditional temperature measurement is replaced by an unobtrusive, easily installed assembly. Separate specialized electrical connections are replaced by a single parallel circuit of standard telecommunications-grade wiring. Advantageously, the sensor assembly provides broad sensor coverage in an easily installed package. The sensor assembly can be produced at a low cost, and is easily manufactured using existing assembly techniques.

A cost effective network of digital sensors has many advantages over traditional methods. Systems sometimes referred to as "smart cooling" systems have been developed to provide a networked environmental monitor comprising a plurality of temperature sensors, located at various locations throughout a data center, to dynamically collect temperature data at various locations within the data center. By dynamically collecting temperature data at various locations within the data center, the cooling resources of the data center can be allocated based on the actual cooling requirements of the data center. As a result, substantial savings in operational costs related to the operation of the data center cooling resources is possible.

Figure 6:
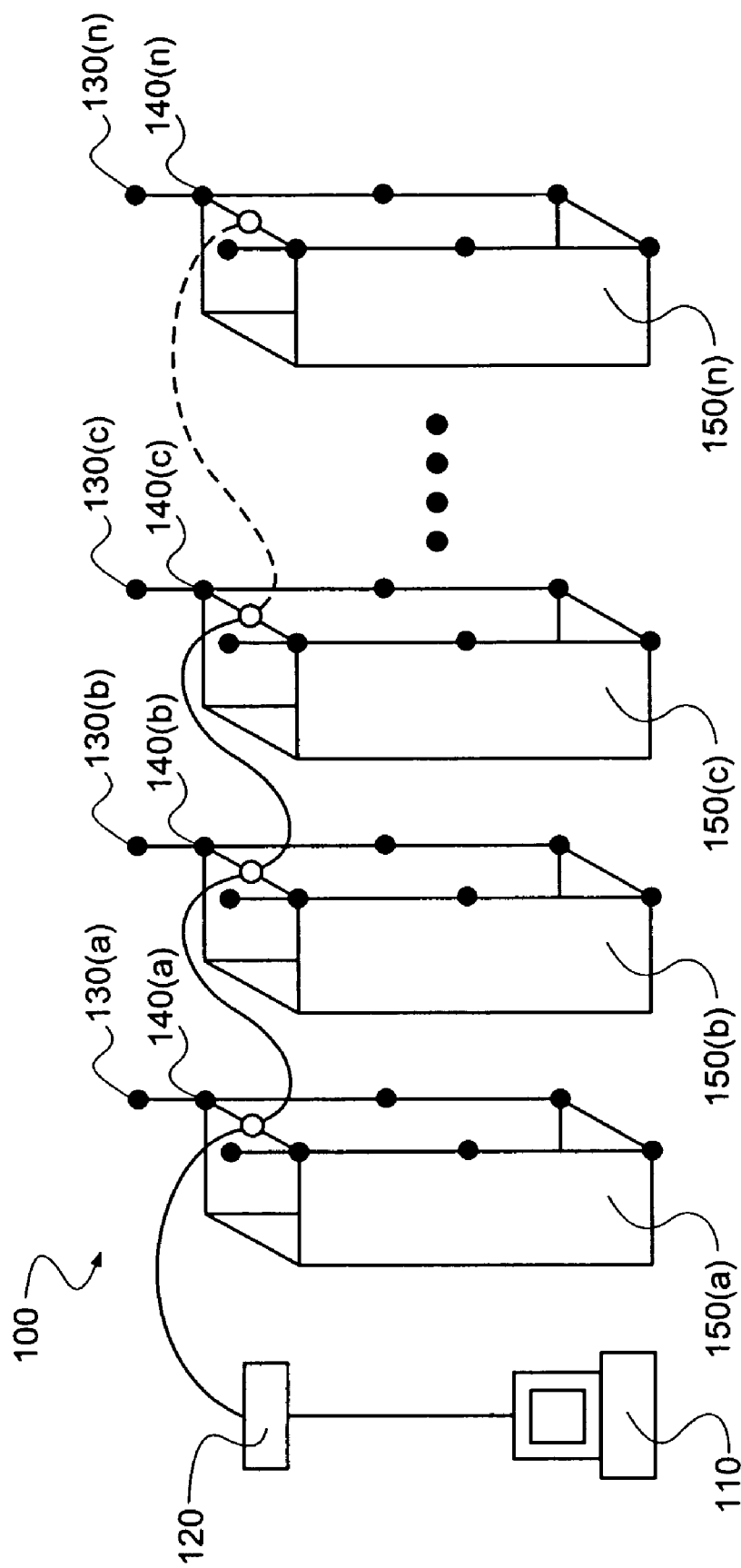
FIG. 6 is a schematic illustration of one embodiment of a rack system provided with sensors.
Figure 7:
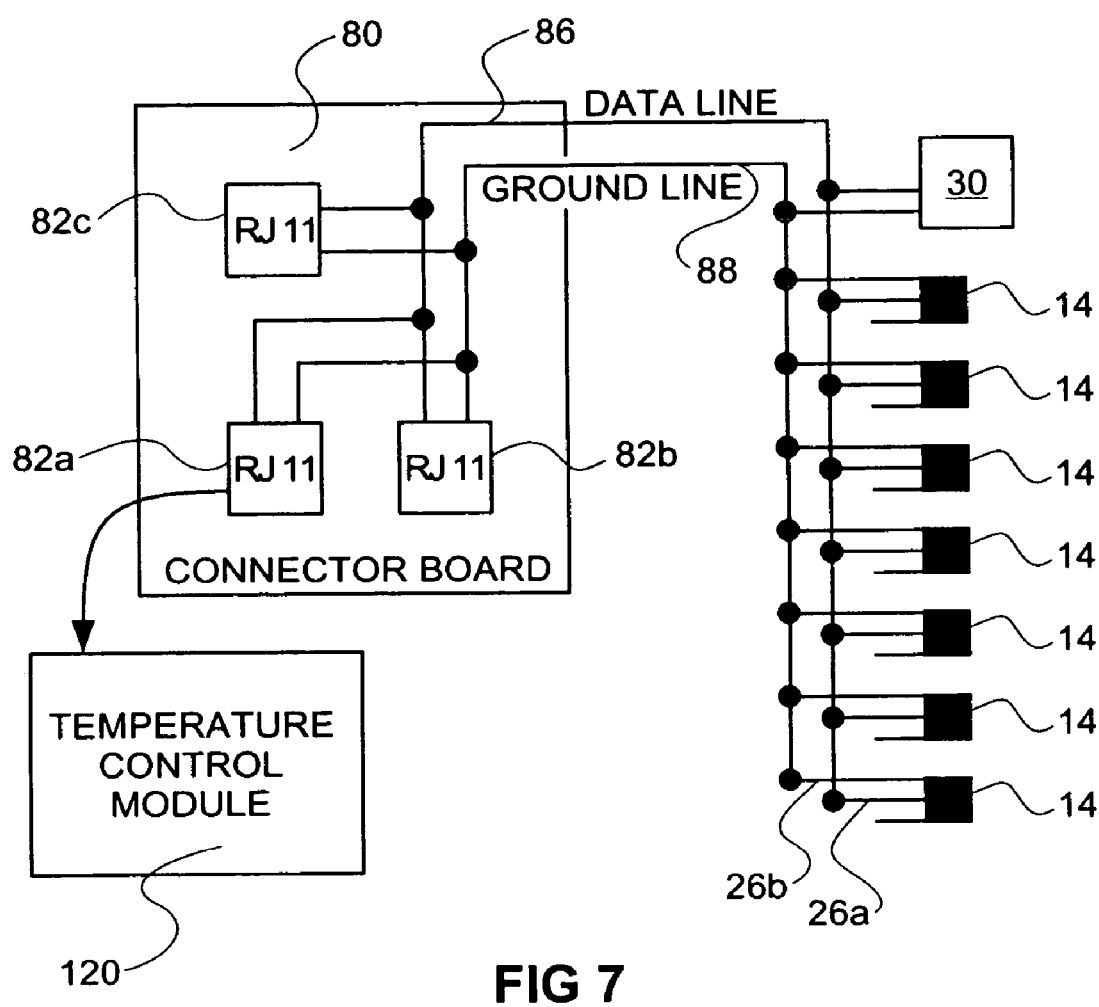
FIG. 7 shows a sensor connection scheme that can be implemented using the sensor assembly shown herein.

The sensor assembly shown herein is compatible with "smart cooling" systems and their associated temperature data collection system. The various elements and aspects of a networked environmental monitoring system for collecting and using temperature data from a large number of sensors in a data center are depicted in FIGS. 6-7. In the context of "smart cooling" it is necessary to deploy a number of sensors on the front and rear surfaces of computer equipment racks. Provided in FIG. 6 is an illustration of one embodiment of a system 100 for collecting temperature data that could incorporate the sensor assembly disclosed herein. The installation in which the temperature collection system is illustrated is a data center, though it will be apparent that the sensor assembly is not limited to use in data centers. The temperature collection system includes a central computer system 110, a temperature-collection module 120, a plurality of computer racks 150($a \ldots n$) wherein each of the plurality of computer racks includes a plurality of temperature sensors 130($a \ldots n$) and a connector board 140($a \ldots n$). The temperature-collection module is coupled to at least one of the connector boards, and to the central computer system.

The method of collecting temperature data using the system depicted in FIG. 6 involves the steps of coupling a plurality of sensors to at least one rack of systems. The plurality of sensors are then interconnected to the central computer system. The central computer system then collects temperature data from each of the plurality of sensors, and controls the data center cooling system in accordance with that temperature information.

The computer system 110 may be any of a variety of different types, such as a notebook computer, a desktop computer, an industrial personal computer, an embedded computer, etc. The computer system includes a processor and various other components such as a user interface (e.g. keyboard, mouse, voice recognition system, etc.), and an output device (e.g. a computer monitor, a television screen, a printer, etc.), depending upon the desired functions of the computer system. A communications port can also be coupled to the processor to enable the computer system to communicate with an external device or system, such as a printer, another computer, or a network.

The computer system 110 may also be utilized in conjunction with a distributed computing environment where tasks are performed by remote processing devices that are linked through a communications network. Examples of such distributed computing environments include local area networks of an office, enterprise-wide computer networks, and the Internet. Additionally, the networks could communicate via wireless means or any of a variety of communication means.

Referring back to FIG. 6, each of the plurality of computer racks 150(a . . . n) includes a plurality of temperature sensors 130(a . . . n). Since the temperature profile of air throughout the system 100 is typically non-uniform, multiple sensors are implemented to capture temperature data at multiple points. In order to get an accurate profile of temperature or other conditions, any number of sensors can be deployed on or near each computer rack. In the configuration shown in FIG. 6, each rack in the data center is shown having 3 sensors on the front and 3 sensors on the rear of the rack case, with two additional overhead sensors disposed above the body of the rack. These sensors provide inputs into the control algorithms employed by "smart cooling" to manage the environment within the datacenter. However, other configurations can also be used. For example, the front sensor assembly shown in FIG. 4 includes three sensors on the center of the door of the rack, with no overhead sensors. The rear sensor assembly shown in FIG. 5 includes six sensors disposed inside the rear door of the rack, with an additional overhead sensor disposed above the rack. Other configurations are also possible.

Each sensor assembly 10 includes a connector wire 16 with a mechanical connector 18 at its end. Associated with each rack 60 is a connector board 80, like the connector board 140 shown in FIG. 6. The connector wire from each sensor assembly connects to the connector board associated with the rack. In one simple configuration, the connector board needs no power and serves as a connection point for each of the plurality of sensors, and as a means for transmitting collected temperature data to the temperature collection module. FIG. 7 shows an example of a connector board and connection scheme that can be utilized in conjunction with various embodiments of the sensor assembly. The connector board includes at least two input ports 82. These first input ports are configured to connect, via the connector, to a ground line and a data line associated with a connector wire.

The input ports 82 can be RJ-11 phone line type ports or any of a variety of types of ports. As an operative example, the first port 82a can be configured to connect the connector board 80 to the temperature collection module 110 or directly to the central computer system 120, while the second data port 82b can be configured to connect to the sensor assembly 10, to collect temperature data from the plurality of sensors 14. Additionally, the first data port 82a can be configured to connect the connector board to another connector board associated with another rack, thereby enabling multiple connector boards to be connected to a central computer system in a daisy chain fashion, like that shown in FIG. 6.

A third input port 82c can also be provided to connect to a second sensor assembly (not shown) that can be associated with the rack. This sort of configuration is suggested by FIGS. 4 and 5. As shown in FIG. 4, the connector wire 16 from the front sensor assembly is connected to the connector board. Likewise, a connector wire from the rear sensor assembly also extends to a connection point with the connector board. Consequently, a third or more additional input ports will be needed to provide connectivity to the interconnecting lines 84 that interconnect the rack to the central computer and/or other racks.

In the connection scheme shown in FIG. 7, the data leads and ground leads of the temperature sensors 14 are coupled in parallel to the first and second RJ11 ports 82a, 82b via the data line 86 and ground line 88. These lines correspond to the flat conductor data line 24a and connector wire data line 16a, and the flat conductor ground line 24b and connector wire ground line 16b, respectively. The memory device is also connected to the data and ground lines at the head of the line of sensors. As a result, the plurality of sensors are connected in parallel to the temperature collection module (120 in FIG. 6) via the data line and the ground line. This concept is advantageous with respect to conventional methodology in that conventional methodology suggests a point-to-point connection from each sensor to a central data collection system. By employing the above-described concepts, multiple temperature sensors are coupled to a central data collection system (the temperature collection module) via the data line and the ground line. This is substantially more efficient than conventional methodology, and allows the temperature sensors to be installed during production and connected together in the field.

Referring back to FIG. 6, the temperature collection module 120 is coupled to the central computer system 110 and at least one of the connector boards 140(a . . . n). The temperature collection module can be included in the central computer system or can be configured in a device separate from the central computer system. In accordance with an embodiment, the temperature collection module collects temperature data from each plurality of temperature sensors 130(a . . . n). The temperature collection module includes connector board interface electronics, temperature collection logic, and central computer system interface electronics. The connector board interface electronics are coupled to the temperature collection logic wherein the temperature collection logic is further coupled to the central computer system interface electronics. The temperature collection logic is further coupled to a temperature data table that maintains the readings of the sensors. One of ordinary skill in the art will readily recognize the elements and features of the temperature collection module can be configured in a variety of ways.

The temperature collection logic periodically queries the data table which contains the temperature readings of each plurality of the sensors. In order to access individual sensors it is necessary to know the address identifier of each of the individual sensors along with the physical location. This issue is complicated by the fact that the individual sensors are factory programmed with unique address information that is not re-programmable. However, this problem is solved by the memory device associated with each sensor assembly. The memory device stores the identifier of each sensor on the sensor assembly. The memory devices are programmed during the assembly of the sensor assembly. Data is stored in the memory device that indicates a unique identifying number for the sensor assembly itself. Also stored in the memory are the unique 1-wire addresses of each sensor device installed on the sensor assembly. These addresses are stored in a table in the same order as the physical order of the devices on the sensor assembly. It would also be possible to associate the sensor assembly with a particular rack if it was installed on this rack at the factory. Alternatively the rack information could be programmed in the field using a simple tool designed for this purpose. Using this information, it is possible for a temperature collection module to automatically configure its data collection logic when a sensor assembly is added to its 1-wire network.

Additionally, in another alternative embodiment, the temperature collection module can be implemented as a "row manager" device. Accordingly, the module can be capable of communication with an Ethernet network connection while communicating with the plurality of sensors.

In accordance with one method of collecting temperature data, a temperature data acquisition process can begin with the periodic querying of each of the sensors in the data center, providing a "start conversion" command whereby the process of taking temperature readings from the individual sensors is initiated. This process takes approximately ¾ to one second per sensor when using the parasitically powered sensor devices described above. If faster results are desired, sensors are available with a separate power supply pin for a much faster response. This would be one configuration in which three conductors in the sensor assembly and in the connecting wire would be needed.

Once the temperature is measured from each sensor, temperature collection logic stores the temperature readings in a data table and generates a temperature profile of the data center based on the temperature readings. Separate temperature tables can be generated based on the varying locations of sensors. For example, based on the location of the sensors temperature profiles can be generated for the front of the rack, the back of the rack, etc.

In varying embodiments, the data center could employ more than one temperature collection module. In this case, the data table in each module will only contain part of the temperature profile of the data center. Accordingly, the central computer can assemble partial profiles of the data center. These partial profiles can subsequently be combined to form a global temperature profile of the data center.

The method of obtaining temperature data from an installation of sensors is generally as follows. A first step includes periodically querying of each of the sensors in the data center. A second step includes providing an initiation command. A third step includes reading the measured temperature of each of the sensors. A final step involves generating a temperature profile of the data center based on the temperature readings. The temperature profile can include a variety of profiles based on the locations of the sensors, and can be presented in a 3-dimensional matrix view format. The above-described method may be implemented, for example, by operating a computer system to execute a sequence of machine-readable instructions. The instructions may reside in various types of computer readable media.

Although the application and use of the sensor assembly is disclosed in the context of a data center, one of ordinary skill in the art will readily recognize that the functionality of the varying embodiments of the sensor assembly can be utilized in a variety of different facilities. Specifically, this type of sensor assembly is by no means limited to data center applications, and is not limited to temperature sensing.

It is to be understood that the above-referenced arrangements are illustrative of the application of the principles of the present invention. It will be apparent to those of ordinary skill in the art that numerous modifications can be made without departing from the principles and concepts of the invention as set forth in the claims.

What is claimed is:

1. A modular sensor assembly for sensing a condition at a computer rack, comprising:
   a) an elongate flexible body, configured to attach to a computer rack;
   b) a plurality of addressable sensors, disposed along the body and interconnected to a common connector wire; and
   c) a connector wire lead, configured to interconnect the connector wire to a central system configured to receive and interpret data from the plurality of sensors relating to conditions associated with the computer rack.

2. A sensor assembly in accordance with claim 1, further comprising a connector board, associated with the computer rack, configured to modularly interconnect the connector wire lead to a communication wire in communication with the central system.

3. A sensor assembly in accordance with claim 2, further comprising a communication wire interconnected between the connector board and a connector board of an additional computer rack having a modular sensor assembly, so as to interconnect a network of modular sensor assemblies to the central system.

4. A sensor assembly in accordance with claim 1, wherein the elongate body comprises a substantially rigid outer covering, containing the connector wire and addressable sensors, having connectors attached thereto for connecting the outer covering to the computer rack.

5. A sensor assembly in accordance with claim 4, wherein the outer covering is configured as a decorative trim strip for the computer rack.

6. A sensor assembly in accordance with claim 4, wherein the outer covering is configured to attach to a door of the computer rack.

7. A sensor assembly in accordance with claim 1, wherein the elongate body comprises a plurality of body segments interconnected by an interconnecting wire.

8. A sensor assembly in accordance with claim 1, further comprising an adhesive, disposed on the elongate body, configured to allow the sensor assembly to be adhesively attached to the computer rack.

9. A sensor assembly in accordance with claim 1, wherein the connector wire and the connector wire lead comprise two electrical conductors, including a data wire and a ground wire, and wherein the plurality of sensors are attached in parallel to the ground wire and the data wire, and configured to draw power from the data wire.

10. A sensor assembly in accordance with claim 1, wherein the sensors are selected from the group consisting of temperature sensors, humidity sensors, fluid pressure sensors, fluid velocity sensors, smoke sensors, occupancy sensors, a computer rack door condition sensor, and light sensors.

11. A sensor system, comprising:
   a) a computer rack;
   b) a modular sensor assembly, having a flexible elongate body, attached to the computer rack;
   c) a plurality of addressable sensors, disposed along the elongate body of the modular sensor assembly, and interconnected in parallel to a common connector wire, configured to independently measure an environmental condition in the immediate vicinity of the sensor;
   d) a connector wire lead, interconnected to the common connector wire; and
   e) a central system, interconnected to the connector wire lead, configured to receive and interpret data from the plurality of addressable sensors.

12. A system in accordance with claim 11, wherein the computer rack includes means for receiving the modular sensor assembly.

13. A system in accordance with claim 12, wherein the means for receiving the modular sensor assembly is selected from the group consisting of a trim strip, associated with the computer rack and configured to receive the modular sensor assembly, and a plurality of apertures, disposed on members of the computer rack, configured to receive connectors associated with the modular sensor assembly.

14. A system in accordance with claim 11, wherein the modular sensor assembly is disposed on a front of the computer rack.

15. A system in accordance with claim 14, wherein the modular sensor assembly is disposed on a front door of the computer rack.

16. A system in accordance with claim 11, wherein the modular sensor assembly is disposed on a rear of the computer rack.

17. A system in accordance with claim 11, wherein the modular sensor assembly is disposed so as to place a sensor above the computer rack.

18. A system in accordance with claim 11, wherein the modular sensor assembly comprises a plurality of flexible elongate body segments interconnected by an interconnecting wire.

19. A system in accordance with claim 11, further comprising a connector board, associated with the computer rack, configured to modularly interconnect the connector wire lead to a communication wire in communication with the central system.

20. A system in accordance with claim 19, further comprising a second modular sensor assembly, connected to the computer rack, and interconnected to the connector board.

21. A system in accordance with claim 19, further comprising a second computer rack having a second connector board and a modular sensor assembly connected to the second computer rack and the second connector board, and a communications wire connected between the connector board and the second connector board.

22. A system in accordance with claim 11, wherein the plurality of sensor devices are selected from the group consisting of temperature sensors, humidity sensors, fluid pressure sensors, fluid velocity sensors, smoke sensors, occupancy sensors, computer rack door condition sensors, and light sensors.

23. A system in accordance with claim 11, wherein the common connector wire comprises two conductors, including a data wire and a ground wire, the sensors being interconnected to the data wire and ground wire in parallel.

24. A system in accordance with claim 23, wherein the sensors are configured to draw power from the data wire.

25. A system in accordance with claim 11, wherein the modular sensor assembly comprises:
 a) a pair of substantially flat flexible conductors, disposed on a substrate, a first of the conductors a ground wire, and a second of the conductors being a data wire; and
 b) a ground lead of each sensor device being connected to the first conductor, and a data lead of each sensor device being connected to the second conductor.

26. A system in accordance with claim 11, wherein the central system comprises an environmental monitor, configured to selectively collect data from each of the addressable sensors, and to determine spatially-correlated environmental conditions related to the computer rack.

27. A system in accordance with claim 11, further comprising a modular sensor assembly disposed on a front of the computer rack, and a modular sensor assembly disposed on a rear of the computer rack, the front sensor assembly being configured to detect a temperature of cooling air supplied to the front of the rack, and the rear sensor assembly being configured to detect a temperature of return air exhausted from the rear of the rack.

28. A computer rack system, comprising:
 a) a generally upright rack body, configured to support heat-generating electronic devices, and to allow cooling air to flow therethrough;
 b) a modular sensor assembly, attached to the rack body, comprising an elongate flexible sensor body having a plurality of addressable sensors connected in parallel to a common connector wire, each sensor being configured to generate a digital signal representative of an environmental condition; and
 c) a connector board, associated with the rack body, interconnected to the connector wire and to a central computer system configured to receive data from the plurality of sensors and to monitor environmental conditions associated with the rack.

* * * * *